(12) United States Patent
Schaefer et al.

(10) Patent No.: US 11,781,650 B2
(45) Date of Patent: *Oct. 10, 2023

(54) EDGE SEAL FOR LOWER ELECTRODE ASSEMBLY

(71) Applicant: Lam Research Corporation, Fremont, CA (US)

(72) Inventors: David Schaefer, Fremont, CA (US); Ambarish Chhatre, San Jose, CA (US); Keith William Gaff, Fremont, CA (US); Sung Je Kim, Pleasanton, CA (US); Brooke Mesler Lai, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 658 days.

This patent is subject to a terminal disclaimer.

(21) Appl. No.: 15/843,849

(22) Filed: Dec. 15, 2017

(65) Prior Publication Data
US 2018/0106371 A1    Apr. 19, 2018

Related U.S. Application Data

(60) Division of application No. 13/528,194, filed on Jun. 20, 2012, now Pat. No. 9,869,392, which is a
(Continued)

(51) Int. Cl.
*F16J 15/02*    (2006.01)
*H01J 37/32*    (2006.01)
(Continued)

(52) U.S. Cl.
CPC ......... *F16J 15/021* (2013.01); *H01J 37/3255* (2013.01); *H01J 37/32495* (2013.01);
(Continued)

(58) Field of Classification Search
None
See application file for complete search history.

(56) References Cited

U.S. PATENT DOCUMENTS

| | | | | |
|---|---|---|---|---|
| 5,040,905 A | * | 8/1991 | Boyd | F16C 17/02 384/130 |
| 5,636,098 A | * | 6/1997 | Salfelder | H01L 21/6831 361/234 |

(Continued)

OTHER PUBLICATIONS

International Preliminary Report on Patentability dated Apr. 22, 2014 for PCT/US2012/061020; 10 pages.
(Continued)

*Primary Examiner* — Jeffrie R Lund
*Assistant Examiner* — Tiffany Z Nuckols

(57) ABSTRACT

An edge seal for sealing an outer surface of a lower electrode assembly configured to support a semiconductor substrate in a plasma processing chamber, the lower electrode assembly including an annular groove defined between a lower member and an upper member of the lower electrode assembly. The edge seal includes an elastomeric band configured to be arranged within the groove, the elastomeric band having an annular upper surface, an annular lower surface, an inner surface, and an outer surface. When the elastomeric band is in an uncompressed state, the outer surface of the elastomeric band is concave. When the upper and lower surfaces are axially compressed at least 1% such that the elastomeric band is in a compressed state, an outward bulging of the outer surface is not greater than a predetermined distance. The predetermined distance corresponds to a maximum outer diameter of the elastomeric band in the uncompressed state.

13 Claims, 11 Drawing Sheets

Related U.S. Application Data continuation-in-part of application No. 13/277,873, filed on Oct. 20, 2011, now Pat. No. 9,859,142.

(51) Int. Cl.
  *H02N 13/00* (2006.01)
  *H01L 21/683* (2006.01)

(52) U.S. Cl.
  CPC .. *H01J 37/32532* (2013.01); *H01J 37/32568* (2013.01); *H01J 37/32715* (2013.01); *H01J 37/32724* (2013.01); *H01L 21/6831* (2013.01); *H01L 21/6833* (2013.01); *H01L 21/6838* (2013.01); *H02N 13/00* (2013.01); *Y10T 29/49908* (2015.01)

(56) References Cited

U.S. PATENT DOCUMENTS

| | | | | |
|---|---|---|---|---|
| 5,805,408 A | * | 9/1998 | Maraschin | H01L 21/6833 361/234 |
| 6,540,234 B1 | * | 4/2003 | Atkinson | F16J 15/0825 277/612 |
| 7,993,457 B1 | * | 8/2011 | Krotov | C23C 16/45544 118/719 |
| 9,859,142 B2 | * | 1/2018 | Schaefer | H01L 21/6833 |
| 9,869,392 B2 | | 1/2018 | Schaefer et al. | |
| 10,090,211 B2 | * | 10/2018 | Gaff | H01J 37/32522 |
| 2005/0042881 A1 | * | 2/2005 | Nishimoto | H01L 21/67248 438/710 |
| 2014/0083461 A1 | * | 3/2014 | Shih | H01L 21/6833 134/19 |
| 2018/0106371 A1 | | 4/2018 | Schaefer et al. | |
| 2018/0366379 A1 | | 12/2018 | Gaff et al. | |

OTHER PUBLICATIONS

Translation of Notification of the Office Action corresponding to Korean Patent Application No. 10-2014-7013567, dated Mar. 14, 2019, 2 pages.

\* cited by examiner

EDGE SEAL FOR LOWER ELECTRODE ASSEMBLY

CROSS-REFERENCE TO RELATED APPLICATIONS

This application is a divisional of U.S. patent application Ser. No. 13/528,194, entitled Edge Seal for Lower Electrode Assembly, filed on Jun. 20, 2012, which is a continuation-in-part of U.S. patent application Ser. No. 13/277,873, entitled Edge Seal for Lower Electrode Assembly, filed on Oct. 20, 2011, the entire content of which is incorporated herein by reference.

FIELD OF THE INVENTION

The present disclosure relates to improvements in edge seals for lower electrode assemblies used in plasma processing chambers such as plasma etch reactors.

BACKGROUND

Integrated semiconductor circuits have become the primary components of most electronics systems. These miniature electronic devices may contain thousands of the transistors and other circuits that make up the memory and logic subsystems of microcomputer central processing units and other integrated circuits. The low cost, high reliability and speed of these circuits have led them to become a ubiquitous feature of modem digital electronics.

The fabrication of integrated semiconductor circuits typically takes place in a reactive ion etching system, such as a parallel plate reactor or inductively coupled plasma reactor. A reactive ion etching system may consist of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, He or Ar is introduced into the etching chamber and maintained at a pressure which is typically in the millitorr range. The upper electrode is provided with gas hole(s) which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched side walls.

SUMMARY

A lower electrode assembly useful for supporting a semiconductor substrate in a plasma processing chamber comprises an upper plate, a temperature controlled lower base plate, a mounting groove surrounding a bond layer in the lower electrode assembly, and an edge seal comprising an elastomeric band having an outer concave surface in an uncompressed state, the band mounted in the groove such that upper and lower ends of the band are axially compressed and a maximum outward bulging of the band is no greater than a predetermined distance.

DETAILED DESCRIPTION

A lower electrode assembly typically includes an electrostatic clamping layer on which a wafer is clamped during processing in a plasma processing chamber. The lower electrode assembly can also include various layers bonded to a temperature controlled base plate. For example, the assembly can include an upper ceramic layer incorporating one or more electrostatic electrodes adhesively bonded to an upper side of a heater plate, one or more heaters adhesively bonded to a bottom of the heater plate, and a base plate adhesively bonded to the heaters and heater plate. To protect the exposed adhesive bond layers, the heater plate has a smaller diameter than the ceramic layer and base plate and an edge seal of elastomeric material is located in a mounting groove between the ceramic layer and the base plate. To provide an effective seal, the edge seal is axially compressed 1 to 20%, preferably about 5% to completely fill the mounting groove. For an edge seal in the form of a ring with a rectangular cross section, such compression causes the outer surface of the seal to bulge outwardly and such outward expansion could contact a surrounding edge ring. To address this problem, the edge seal is configured to account for changes in dimensions due to radial expansion.

To protect the bond layers, the edge seal can comprise an elastomeric band with a concave outer surface whereby axial compression of the band when mounted in the mounting groove does not cause expansion of the band's outer surface beyond a predetermined distance such as the maximum outer diameter of the band in an uncompressed state. The elastomeric band is designed to fit in a rectangular mounting groove such that the elastomeric band is constrained on three sides, with the fourth side being unconstrained and exposed to reactive chamber conditions, thereby protecting the bond layers.

Figure 1:
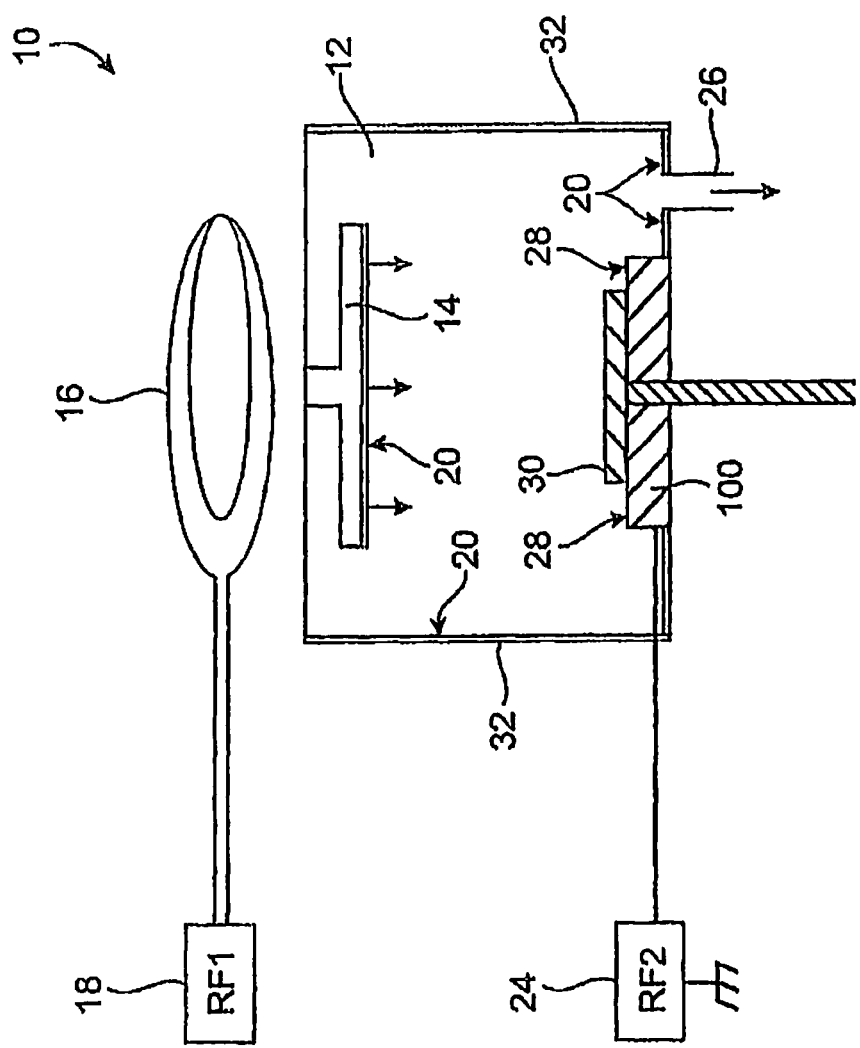
FIG. 1 shows a cross-sectional view of a processing chamber suitable for plasma etching semiconductor substrates.

FIG. 1 shows a cross-sectional view of an exemplary plasma reactor 10 for etching substrates. As shown in FIG. 1, the plasma reactor 10 includes a plasma processing chamber 12, an antenna disposed above the chamber 12 to generate plasma, which is implemented by a planar coil 16. The RF coil 16 is typically energized by an RF generator 18 via a matching network (not shown). Such chambers are called inductively coupled plasma (ICP) chambers. To supply process gas to the interior of the chamber 12, there is provided a gas distribution plate or showerhead 14, which preferably includes a plurality of holes for releasing gaseous source materials, e.g., the etchant source gases, into the RF-induced plasma region between the showerhead 14 and a semiconductor substrate or wafer 30 supported on a lower electrode assembly 28. While an inductively coupled plasma reactor is shown in FIG. 1, the plasma reactor 10 can incorporate other plasma generating sources such as capacitive coupled plasma (CCP), microwave, magnetron, helicon, or other suitable plasma generating equipment, in which case the antenna is omitted.

The gaseous source materials may also be introduced into the chamber 12 by other arrangements such as one or more gas injectors extending through the top wall and/or gas ejection ports built into the walls of chamber 12. Etchant source chemicals include, for example, halogens such as $Cl_2$ and $BCl_3$ when etching through aluminum or one of its alloys. Other etchant chemicals (e.g., $CH_4$, HBr, HCl, $CHCl_3$) as well as polymer forming species such as hydrocarbons, fluorocarbons, and hydro-fluorocarbons for sidewall passivation of etched features may also be used. These gases may be employed along with optional inert and/or nonreactive gases.

In use, a wafer 30 is introduced into chamber 12 defined by chamber walls 32 and disposed on the lower electrode assembly 28. The wafer 30 is preferably biased by a radio frequency generator 24 (also typically via a matching network). The wafer 30 can comprise a plurality of integrated circuits (ICs) fabricated thereon. The ICs, for example, can include logic devices such as PLAs, FPGAs and ASICs or memory devices such as random access memories (RAMs), dynamic RAMs (DRAMs), synchronous DRAMs (SDRAMs), or read only memories (ROMs). When the RF power is applied, reactive species (formed from the source gas) etch exposed surfaces of the wafer 30. The by-products, which may be volatile, are then exhausted through an exit port 26. After processing is complete, the wafer 30 can be subjected to further processing and eventually diced to separate the ICs into individual chips.

The plasma exposed surfaces of any plasma confinement apparatus (not shown), chamber wall 32, chamber liner (not shown) and/or showerhead 14 can be provided with a plasma sprayed coating 20 with surface roughness characteristics that promote polymer adhesion. In addition, plasma exposed surfaces of the substrate support 28 can also be provided with a plasma sprayed coating (not shown). In this manner, substantially all surfaces that confine the plasma will have surface roughness characteristics that promote polymer adhesion. In this manner, particulate contamination inside the reactor can be substantially reduced.

It can be appreciated that the reactor 10 can also be used for metal, dielectric and other etch processes. In plasma etch processing, the gas distribution plate can be a circular plate situated directly below a dielectric window in an ICP reactor or form part of an upper electrode assembly in a CCP reactor called a parallel plate reactor wherein the gas distribution plate is a showerhead electrode oriented parallel to a semiconductor substrate or wafer 30. The gas distribution plate/showerhead electrode contains an array of holes of a specified diameter and spatial distribution to optimize etch uniformity of the layers to be etched, e.g., a photoresist layer, a silicon dioxide layer and an underlayer material on the wafer.

An exemplary parallel-plate plasma reactor that can be used is a dual-frequency plasma etch reactor (see, e.g., commonly-owned U.S. Pat. No. 6,090,304, which is hereby incorporated by reference in its entirety). In such reactors, etching gas can be supplied to a showerhead electrode from a gas supply and plasma can be generated in the reactor by supplying RF energy at different frequencies from two RF sources to the showerhead electrode and/or a bottom electrode. Alternatively, the showerhead electrode can be electrically grounded and RF energy at two different frequencies can be supplied to the bottom electrode.

Figure 2:
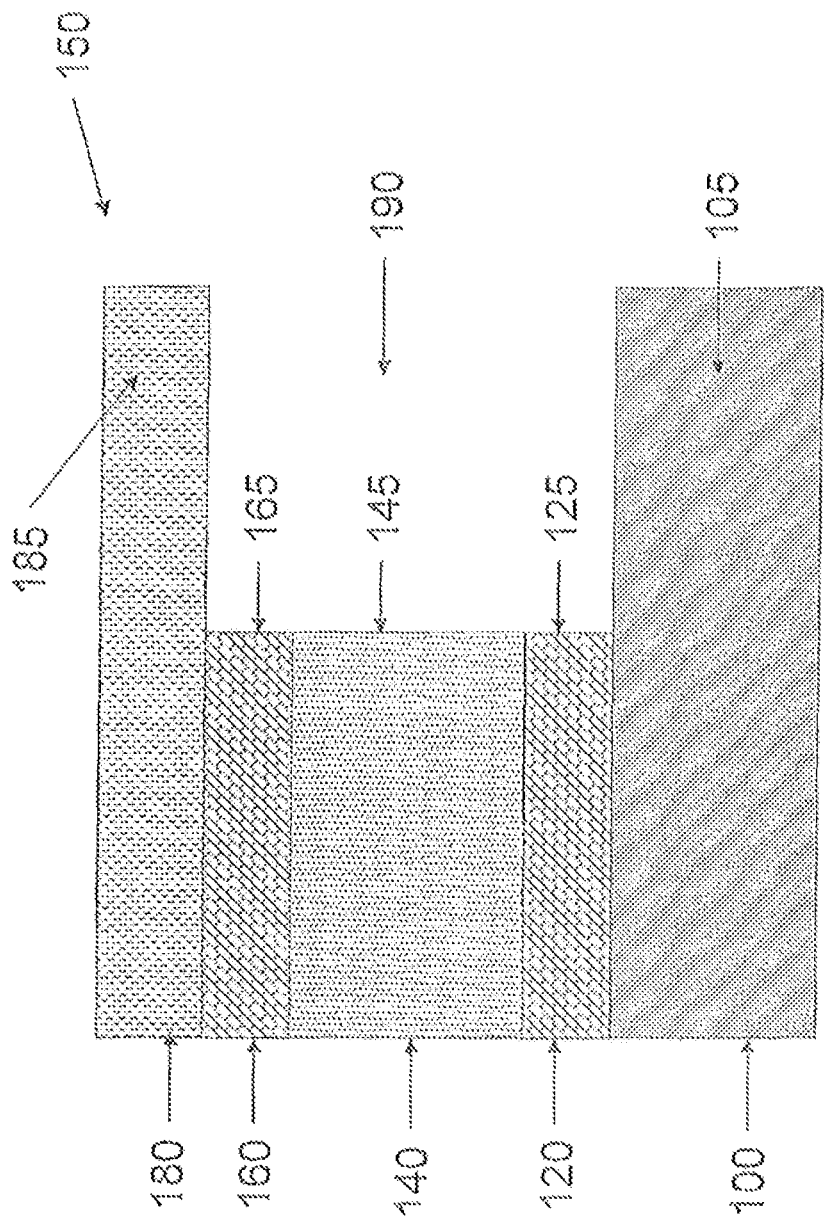
FIG. 2 shows a cross-sectional view of an upper ceramic layer and lower base plate of an electrode assembly having a mounting groove therebetween.

FIG. 2 shows a cross-sectional view of a lower electrode assembly 150 having various layers bonded together with exposed bond layers located in a mounting groove adapted to receive an edge seal comprising an elastomeric band. The electrode assembly 150 comprises an upper ceramic member 180 incorporating an electrostatic clamping electrode and attached to a lower member 100 such as a temperature controlled base plate. Disposed between the upper member 180 and the lower member 100 is a heater plate 140 comprising a metal or ceramic plate and one or more heaters such as a film heater coupled to the bottom of the plate. Adhesive bonding layer 120 is disposed between the lower member 100 and the heater plate 140 and bonds lower member 100 to heater plate 140. Adhesive bonding layer 160 is disposed between the upper member 180 and the heater plate 140 and bonds upper member 180 to heater plate 140. The upper member 180 and lower member 100 extend beyond the heater plate 140 and bonding layers 120, 160 to form an annular groove 190. The outer peripheries 145, 125, 165 of the heater plate 140 and bond layers 120, 160 are substantially aligned with respect to one another. The outer peripheries 185, 105 of the upper member 180 and lower member 100 may or may not be vertically aligned and additional layers may be included between the upper and lower members.

The upper member 180 preferably is an electrostatic clamping layer of ceramic material and embedded electrode comprised of a metallic material, such as W, Mo etc. In addition, the upper member 180 preferably has a uniform thickness from the center to the outer edge or diameter thereof. The upper member 180 is preferably a thin circular plate suitable for supporting 200 mm, 300 mm or 450 mm diameter wafers. Details of a lower electrode assembly having an upper electrostatic clamping layer, heater layer and bonding layers are disclosed in commonly owned U.S. Published Patent Application 2006/0144516 wherein the upper electrostatic clamping layer has a thickness of about 0.04 inch, the upper bonding layer has a thickness of about 0.004 inch, the heater plate comprises a metal or ceramic plate of about 0.04 inch thickness and a heater film of about 0.01 inch thickness, and the lower bonding layer has a thickness of about 0.013 to 0.04 inch. The rectangular mounting groove between the upper clamping layer and the base plate has a height of at least about 0.05 to 0.09 inch and a width of about 0.035 inch. In a preferred embodiment for processing 300 mm wafers, the groove can have a height of at least about 0.07 inch and a width of about 0.035 inch. When inserted in the groove, the edge seal is preferably expanded radially and compressed vertically to tightly fit in the groove. However, if the edge seal has a rectangular cross section it will bulge outwardly and may contact a surrounding edge ring and/or tensile stresses on the outer surface of the edge seal can lead to cracking when exposed to fluorine or oxygen plasmas.

The lower base plate 100 is preferably a circular plate having an upper surface and lower surface. In one embodiment, the lower member 100 can be configured to provide temperature control by the inclusion of fluid channels (not shown) therein through which a temperature controlled liquid can be circulated to the electrode assembly 150. In an electrode assembly 150, the lower member 100 is typically a metal base plate which functions as the lower RF electrode in the plasma chamber. The lower member 100 preferably comprises an anodized aluminum or aluminum alloy. However, it can be appreciated that any suitable material, including metallic, ceramic, electrically conductive and dielectric materials can be used. In one embodiment, the lower member 100 is formed from an anodized machined aluminum block. Alternatively, the lower member 100 could be of ceramic material with one or more electrodes located therein and/or on an upper surface thereof.

As shown in FIG. 2, bond layer 120 bonds the lower member 100 to the heater plate 140. Bond layer 160 bonds the upper member 180 to the heater plate 140. The bond layers 120, 160 are preferably formed from a low modulus material such as an elastomeric silicone or silicone rubber material. However, any suitable bonding material can be used. It can be appreciated that the thickness of the bond layers 120, 160 can vary depending on the desired heat transfer coefficient. Thus, the thickness thereof is adapted to provide a desired heat transfer coefficient based on manufacturing tolerances of the bond layers. Typically, the bond layers 120, 160 will vary over its applied area by plus or minus a specified variable. Typically, if the bond layer thickness does not vary by more than 1.5 percent, the heat transfer coefficient between the upper and lower members 180, 100 can be made substantially uniform.

For example, for an electrode assembly 150 used in the semiconductor industry, the bond layers 120, 160 preferably have a chemical structure that can withstand a wide range of temperatures. Thus, it can be appreciated that the low modulus material can comprise any suitable material, such as a polymeric material compatible with a vacuum environment and resistant to thermal degradation at high temperatures (e.g., up to 500° C.). In one embodiment, bond layers 120, 160 may comprise silicone and be between about 0.001 to about 0.050 of an inch thick and more preferably about 0.003 to about 0.030 of an inch thick.

The heater plate 140 can comprise a laminate bonded to a lower surface of the upper member 180. For example, heater plate 140 can be in the form of a metal or ceramic plate with a film heater coupled to a bottom of the metal or ceramic plate. The heater film can be a foil laminate (not shown) comprising a first insulation layer (e.g., dielectric layer), a heating layer (e.g., one or more strips of electrically resistive material) and a second insulation layer (e.g., dielectric layer). The insulation layers preferably consist of materials having the ability to maintain its physical, electrical and mechanical properties over a wide temperature range including resistance to corrosive gases in a plasma environment such as Kapton or other suitable polyimide films. The heater element(s) preferably consists of a high strength alloy such as Inconel or other suitable alloy or anti-corrosion and resistive heating materials. Typically, the film heater is in the form of a laminate of Kapton, Inconel and Kapton having a total thickness of about 0.005 to about 0.009 of an inch and more preferably about 0.007 of an inch thick.

As shown in FIG. 2, outer peripheries 105, 185 of the lower member 100 and upper member 180 can extend beyond the outer peripheries 145, 125, 165 of the heater plate 140 and bond layers 120, 160, thereby forming a mounting groove 190 in the electrode assembly 150. The material(s) of bond layers 120, 160 are typically not resistant to the reactive etching chemistry of semi-conductor plasma processing reactors and must, therefore, be protected to accomplish a useful operation lifetime. To protect the bond layers 120, 160, it has been proposed to place an edge seal in the form of an elastomeric band into groove 190 to form a tight seal that prevents penetration of the corrosive gases of semi-conductor plasma processing reactors. See, for example, commonly owned U.S. Published Applications 2009/0290145 and 2010/0078899.

Figure 3:
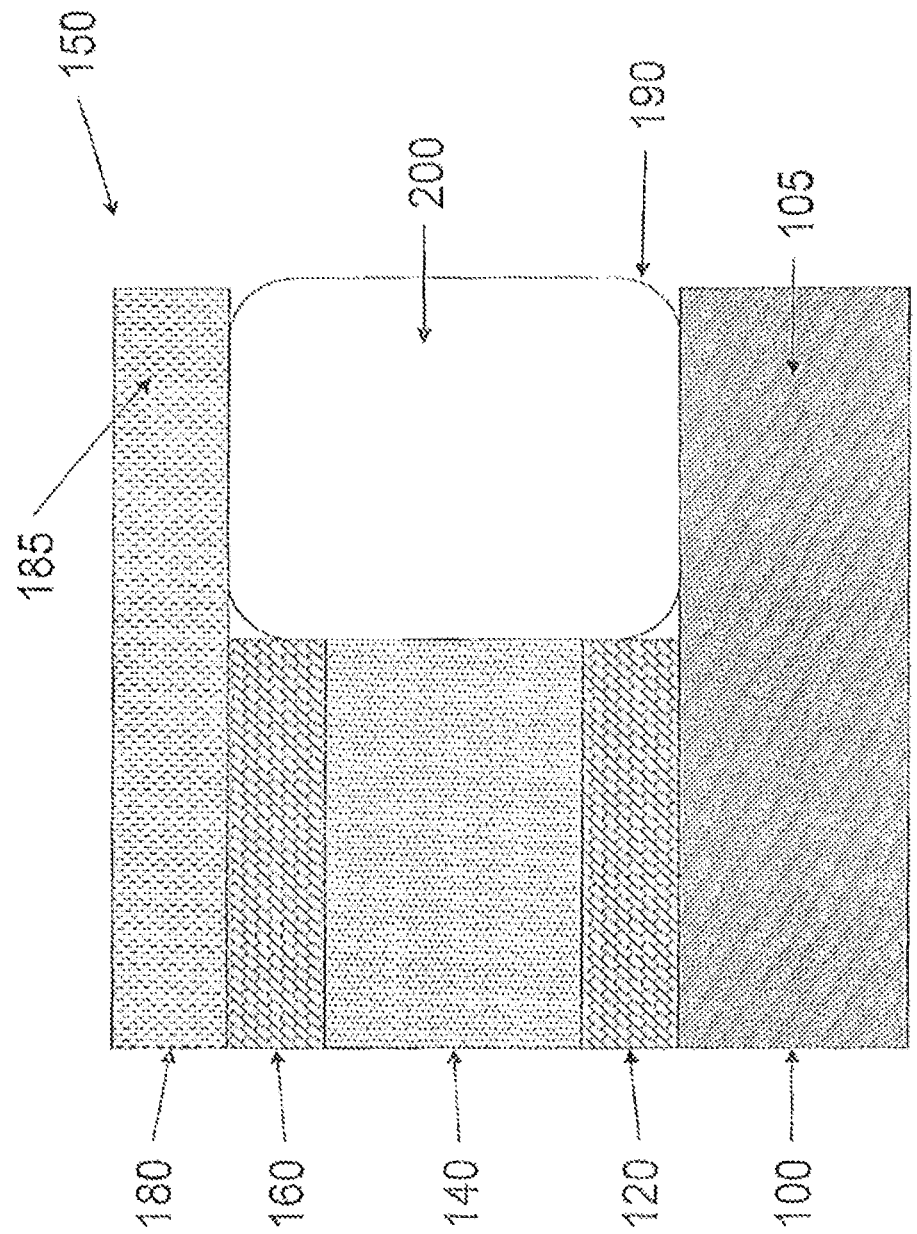
FIG. 3 shows a cross-sectional view of a rectangular elastomeric band disposed in the mounting groove between an upper ceramic layer and lower base plate of an electrode assembly.

FIG. 3. shows a cross-sectional profile of an electrode assembly 150 that includes an annular elastomeric band 200 with a rectangular cross-sectional profile. When the band 200 is disposed in groove 190, the band 200 is axially compressed such that its inner wall bulges away from the outer surface of the heater plate 140 and its outer wall becomes convex in shape. To accommodate for the larger diameter of the band, a surrounding edge ring would need to have its inner diameter expanded or the parts would contact each other and rubbing due to thermal cycling could lead to particle generation in the chamber. To address this problem, the band can be modified to have a shape which avoids undesired bulging when axially compressed in the groove.

Figure 4:
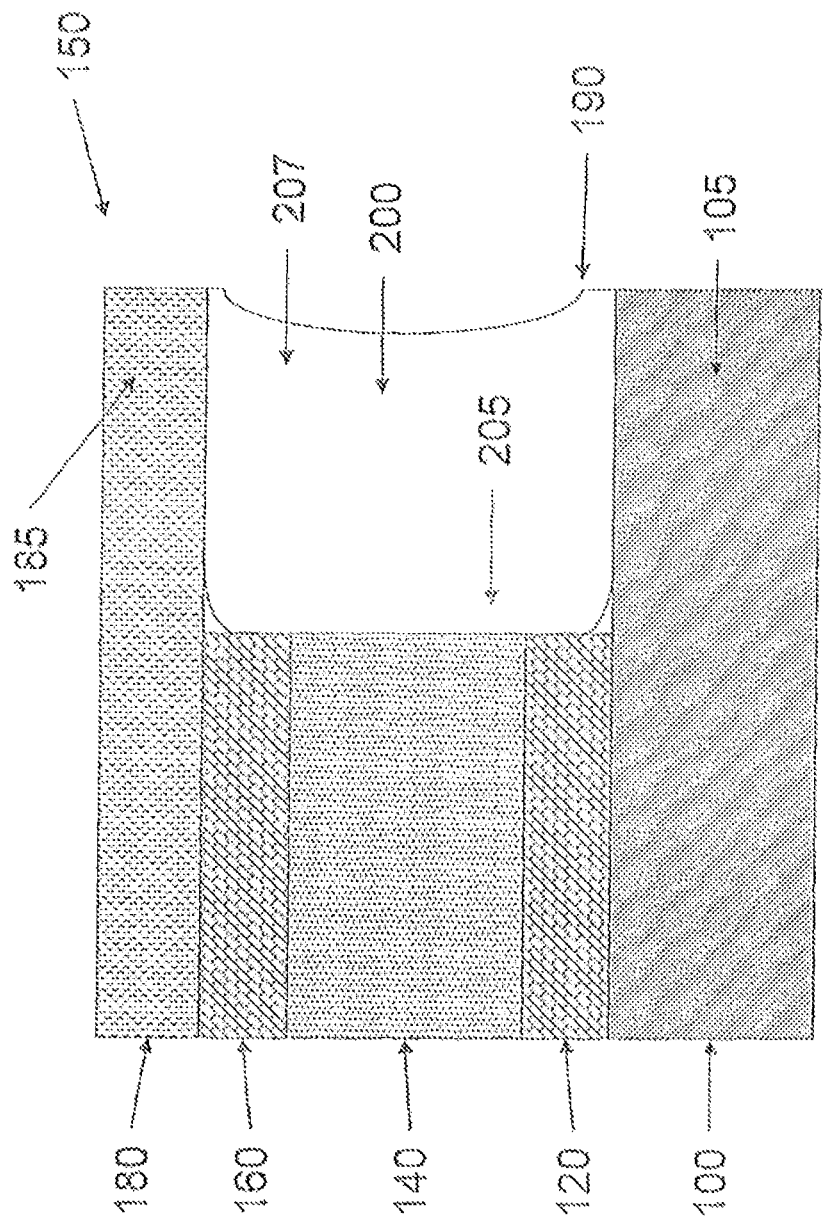
FIG. 4 shows a cross-sectional view of an elastomeric band having a concave outer surface fitted in the mounting groove between an upper ceramic layer and lower base plate of an electrode assembly.

FIG. 4 shows a cross-sectional view of an electrode assembly 150 and modified edge seal comprising elastomeric band 200. The electrode assembly 150 of FIG. 4. is the same as the electrode assembly of FIG. 2 and FIG. 3 but the band 200 has a concave outer surface to reduce bulging when the band is axially compressed in the groove 190. As used herein "concave" means that the outer surface does not have a uniform diameter and instead has a depressed surface formed by one on more curved or inclined surfaces along all or part of the outer surface. The inner surface can have a uniform diameter or the inner surface can also be a concave surface. The outer surface can include one or more cylindrical sections of uniform diameter at the upper and/or lower ends of the band.

The elastomeric band 200 can be constructed from any suitable semiconductor processing compatible material. For example, curable fluoroelastomeric fluoropolymers (FKM) capable of being cured to form a fluoroelastomer or curable perfluoroelastomeric perfluoropolymers (FFKM) can be used. The elastomeric band 200 is preferably constructed of a polymer such as a fluorocarbon polymer material such as Teflon (PTFE—PolyTetraFluoroEthylene, manufactured by DuPont). However, plastics, polymeric materials, Perfluoroalkoxy (PFA), fluorinated polymers, and polyimides can be used. The elastomeric band 200 is preferably comprised of a material having high chemical resistance, low and high temperature capability, resistance to plasma erosion in a plasma reactor, low friction, and electrical and thermal insulation properties. A preferred material is a perfluoroelastomer having a Shore A hardness of 60 to 75 and a specific gravity of 1.9 to 2.1 such as PERLAST available from Perlast Ltd. Another band material is KALREZ available form DuPont Performance Elastomers. PERLAST and KALREZ are FFKM elastomers.

Preferably, the elastomeric band 200 is comprised of a material having high chemical resistance, low and high temperature capability, resistance to plasma erosion in a plasma reactor, low friction, a Shore A hardness less than 85, more preferably a Shore A hardness less than 75, and electrical and thermal insulating properties. Most preferably the elastomeric band is an unfilled elastomer and has a metallic content less than 5000 parts per billion for each and every metal element as metals in the elastomer can result in particle generation and metal contamination on semiconductor substrates during operation.

Figure 5:
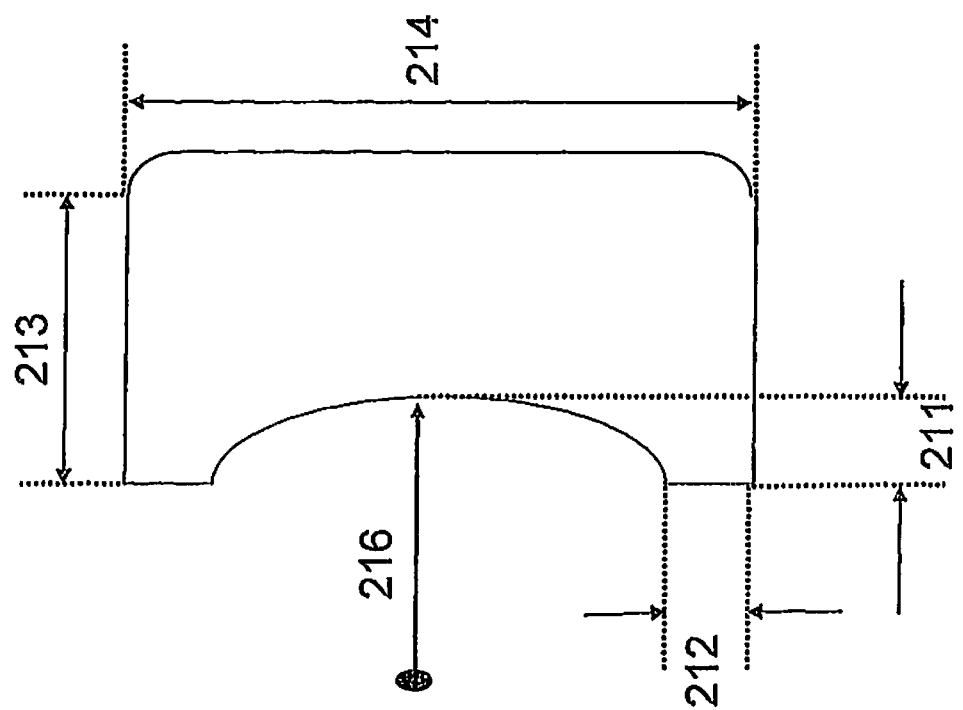
FIG. 5 shows a cross-sectional view of an elastomeric band having a concave outer surface in an uncompressed state.

FIG. 5 shows a cross-sectional view of an elastomeric band 200 in a non-compressed state prior to placement in the groove 190. The dimensions of the elastomeric band 200 are not particularly limited, as long as the dimensions are able to form, or adapt to form, a tight seal in a mounting groove of an electrode assembly such that an outward bulge is minimized, if not eliminated. Preferably, the band geometry is designed to accommodate up to 20% axial compression, preferably 1-15% axial compression, and most preferably 1-10% axial compression and minimize outward bulging of the band beyond its maximum outer diameter in the uncompressed state. For a substrate support designed to support a 200 or 300 mm wafer, the maximum outward bulging due to axial compression is preferably 0.004 inch, more preferably 0.002 inch. In an embodiment, the band includes an inner cylindrical surface of uniform diameter, a flat annular upper surface, a flat annular lower surface smaller in width than the upper surface, and a concave outer surface. In a preferred embodiment, the band can have a height of about 0.131 inch and maximum width of about 0.035 inch, the outer surface including an upper cylindrical section of uniform diameter extending vertically about 0.01 inch from the upper surface and a curved surface having a radius of about 0.35 inch extending from the upper cylindrical surface and an optional lower cylindrical surface extending vertically from the lower surface. Each corner of the band is preferably rounded with a radius of 0.002 to 0.01 inch. For other groove sizes, the height 214 of the elastomeric band 200 is not particularly limited and can be between about 0.05 to about 0.15 inches. The width 213 of the elastomeric band 200 is not particularly limited and can be between about 0.02 to about 0.10 inches, e.g., 0.025 to 0.050 inch. Dimension 211 is the depth of concavity of elastomeric band 200. This dimension is not particularly limited and can be between about 0.001 to about 0.010 inches, or between about 0.001 to about 0.07 inch. Dimension 212 is an optional flat portion of the elastomeric band 200 in accordance with the present invention, as the concavity does not have to extend the entire height 214 of elastomeric band 200. The optional upper flat portion may contribute to decreasing the erosion rate of the elastomeric band 200, as well as the bonding layers 120, 160 protected by the elastomeric band 200. Dimension 212 can be from about 0.01 to about 0.1 inches. The concavity of the elastomeric band 200 can have a radius of curvature from about 0.2 to about 0.8 inches or be formed by one or more inclined surfaces.

In an alternate embodiment, the concavity of the elastomeric band 200 can have a radius of curvature from about 0.02 to about 0.8 inch or be formed by one or more inclined surfaces.

Figure 6:
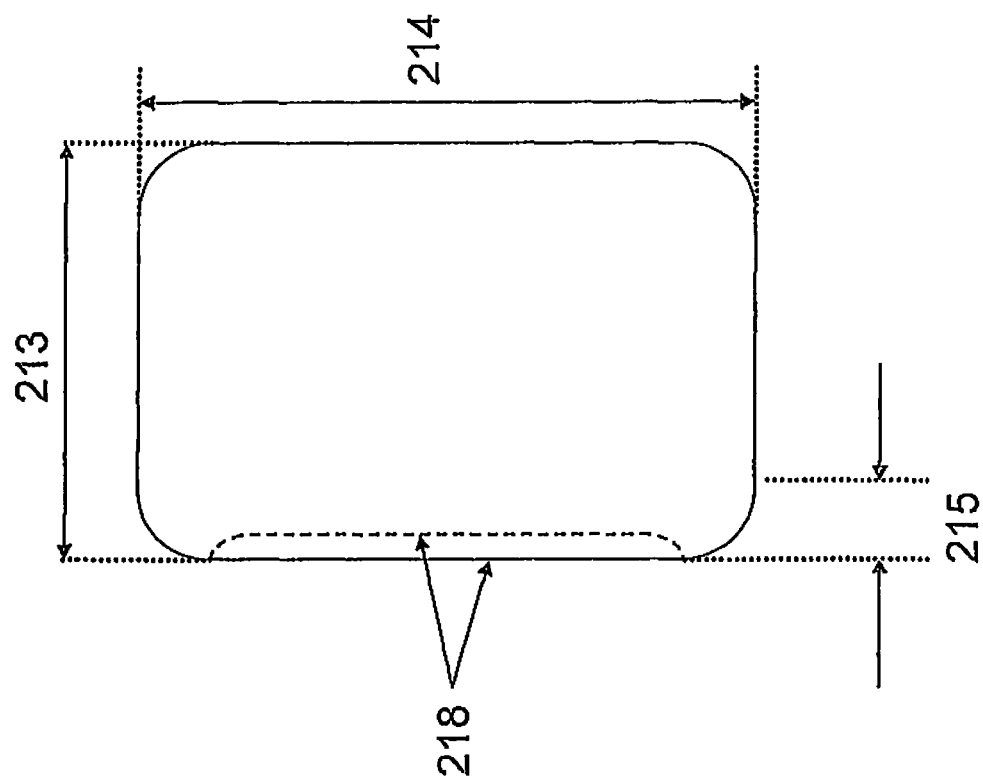
FIG. 6 shows a cross-sectional view of an elastomeric band having a concave outer surface under compression such that the degree of compression in an axial direction is ten to fifteen percent.

The elastomeric band 200 of FIG. 6 is shown in a compressed state (e.g., inserted into a groove of an electrode assembly). The compressed state refers to the compression of the height 214 of elastomeric band 200 when inserted into a groove of an electrode assembly. Typical compression is generally between 1%-20%, or between 1%-15%, and more specifically, between 1-10%, and most preferably about 5%. In other words, if the height 214 of elastomeric band 200 is 1.0 inch when uncompressed, a 10% compression results in elastomeric band 200 having a height 214 of 0.9 inches. Dimension 215 is a predetermined distance corresponding to the allowable bulging tolerance of elastomeric band 200 under a given compression rate. Under compression, the elastomeric band 200 may retain it's concave characteristics, as denoted by the dotted line of 218, or the band 200 may not retain it's concave characteristics, as denoted by the solid line of 218. However, the band may bulge beyond line 218 provided the extent of the bulging is not so much that the band contacts a surrounding edge ring. As an example, dimension 215 can be set such that the allowable bulge tolerance does not allow for the elastomeric band 200 to significantly extend beyond the outer peripheries 185, 105 of the upper member 180 and lower member 100. Dimension 215 can be between about 0.001 to about 0.01 inches, and is preferably less than about 0.004 inches. Dimension 215 can be limited to less than 0.004 inches if optional cylindrical section 212 (shown in FIG. 5) is included at the top of the band and is about 0.01 inches in height, with the remainder of the outer surface having a radius of curvature 216 of about 0.35 inch. A preferred aspect ratio of height:thickness of the band is 2 to 5.

In an alternate embodiment, dimension 215 can be limited to less than 0.004 inches if optional cylindrical section 212 (shown in FIG. 5) is included at the top of the band and is about 0.01 inches in height, with the remainder of the outer surface having a radius of curvature 216 of about 0.04 inch.

Methods of making an electrode assembly 150 with an elastomeric band 200 are not particularly limited and may comprise heating the band to expand it and pressing the heated band in the groove between the upper and lower members. In an alternative method, the band is expanded and fitted around the heater plate prior to bonding the upper member to the heater plate. In use, the band protects the bonding layers during processing of a wafer supported on the upper member.

Figure 7:
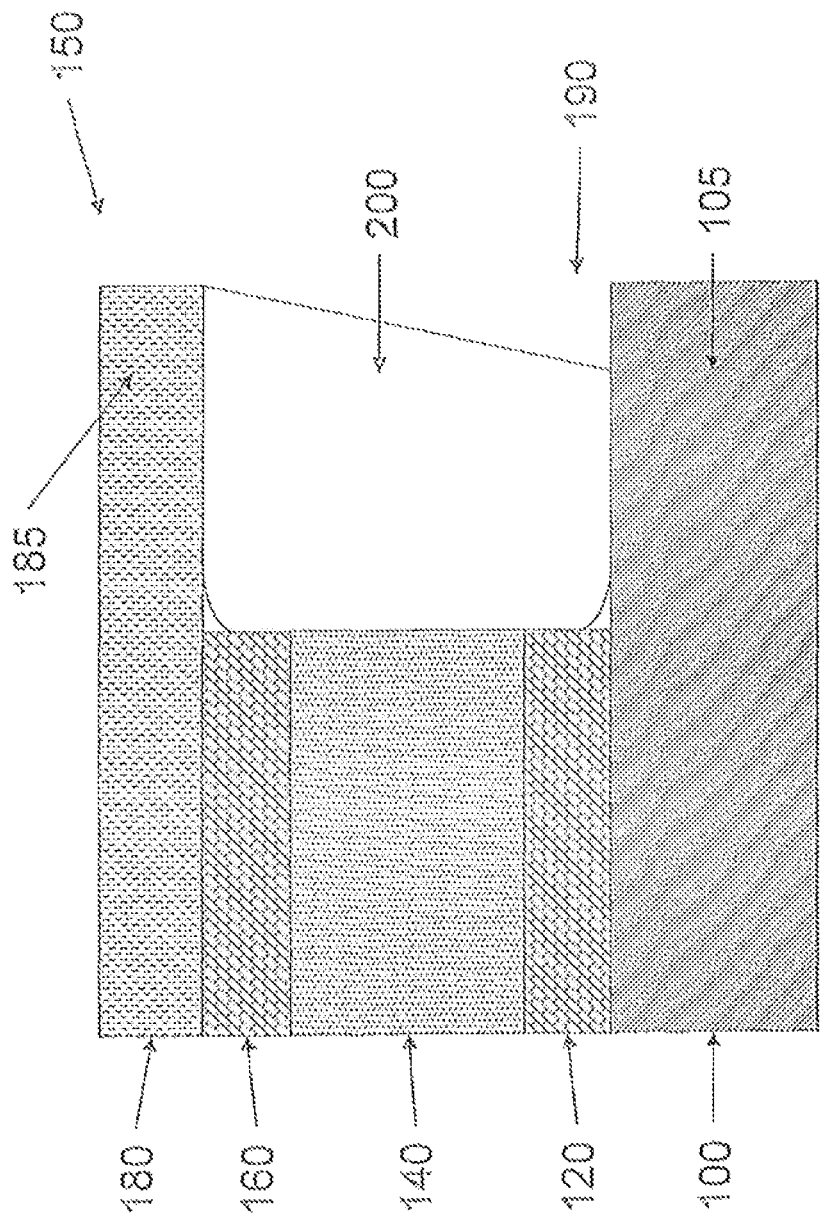
FIG. 7 shows a cross-sectional view of an elastomeric band having an inclined outer surface fitted in the mounting groove between an upper ceramic layer and lower base plate of an electrode assembly.

FIG. 7 shows a cross-sectional view of an elastomeric band 200 in accordance with another embodiment wherein the outer surface of the elastomeric band is an inclined surface oriented such that the band is wider at its upper end.

Figure 8:
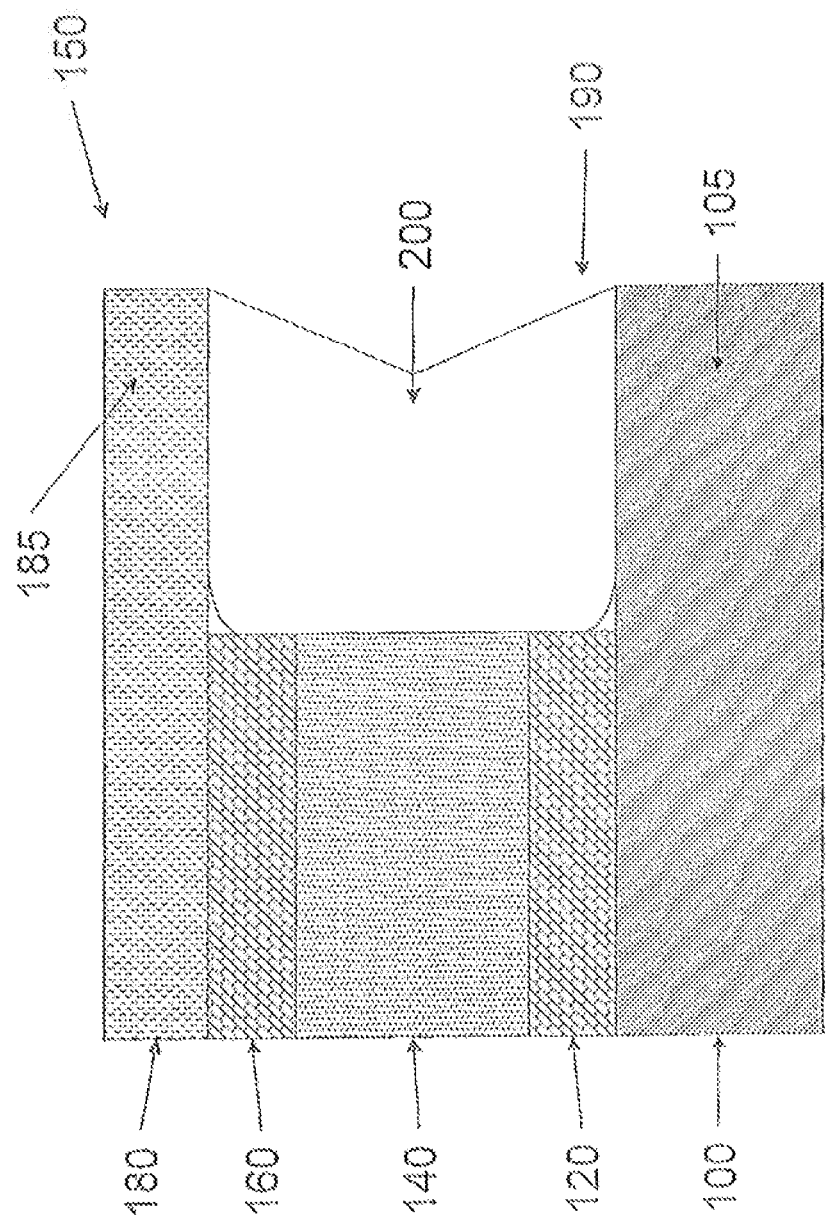
FIG. 8 shows a cross-sectional view of an elastomeric band having a pair of outer converging surfaces fitted in a mounting groove between an upper ceramic layer and lower base plate of an electrode assembly.

FIG. 8 shows a cross-sectional view of an elastomeric band 200 wherein the outer surface of the elastomeric band comprises two converging surfaces that form an angle that is less than 180° with respect to each other. For example, the angle formed by the two surfaces may be 110 to 140°, preferably about 120°.

Figure 9:
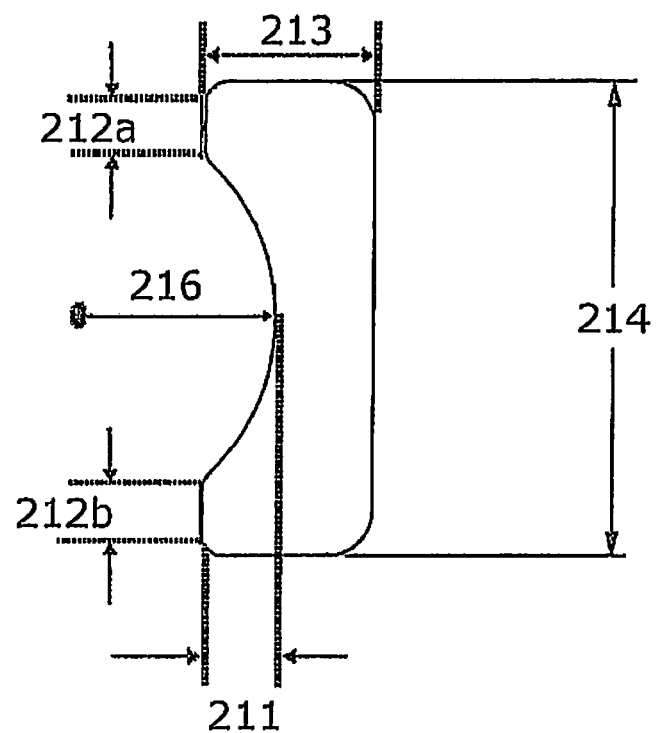
FIG. 9 shows a cross-sectional view of an alternate embodiment of an elastomeric band having a concave outer surface and flat portions on upper and lower ends of the outer surface in an uncompressed state.

FIG. 9 shows a cross-sectional view of an elastomeric band 200 in accordance with another embodiment wherein the elastomeric band 200 is in a non-compressed state prior to placement in the groove 190. Preferably, the band geometry is designed to accommodate up to 20% axial compression preferably 1-15% axial compression and minimize outward bulging of the band beyond its maximum outer diameter in the uncompressed state. For a substrate support designed to support a 200 or 300 mm wafer, the maximum outward bulging due to axial compression is preferably 0.004 inch, more preferably 0.002 inch. In an embodiment, the band includes an inner cylindrical surface of uniform diameter, a flat annular upper surface, a flat annular lower surface, and an outer surface including an outer upper cylindrical section of uniform diameter extending from the annular upper surface, an outer lower cylindrical section of uniform diameter extending from the annular lower surface, and a curved surface of uniform radius extending between the outer upper cylindrical surface and the outer lower cylindrical surface.

The height 214 of the elastomeric band 200 is preferably about 0.087 inch and the width 213 about 0.031 inch. The inner diameter of the elastomeric band 200 is about 11.3 inches. Dimension 211 is the depth of concavity of elastomeric band 200 which is about 0.013 inch. Dimensions 212a,b are the heights of the outer upper cylindrical surface and the outer lower cylindrical surface of the elastomeric band 200, as the concavity does not have to extend the entire height 214 of elastomeric band 200. Dimensions 212a,b have a height of about 0.01 inch. The outer upper cylindrical surface and the outer lower cylindrical surface may contribute to decreasing the erosion rate of the elastomeric band 200, as well as the bonding layers 120, 160 protected by the elastomeric band 200. The radius of curvature 216 of the curved surface of uniform radius extending between the outer upper cylindrical surface and the outer lower cylindrical surface is preferably about 0.04 inch. Each corner of the band is preferably rounded with a radius of 0.002 to 0.01 inch.

Figure 10:
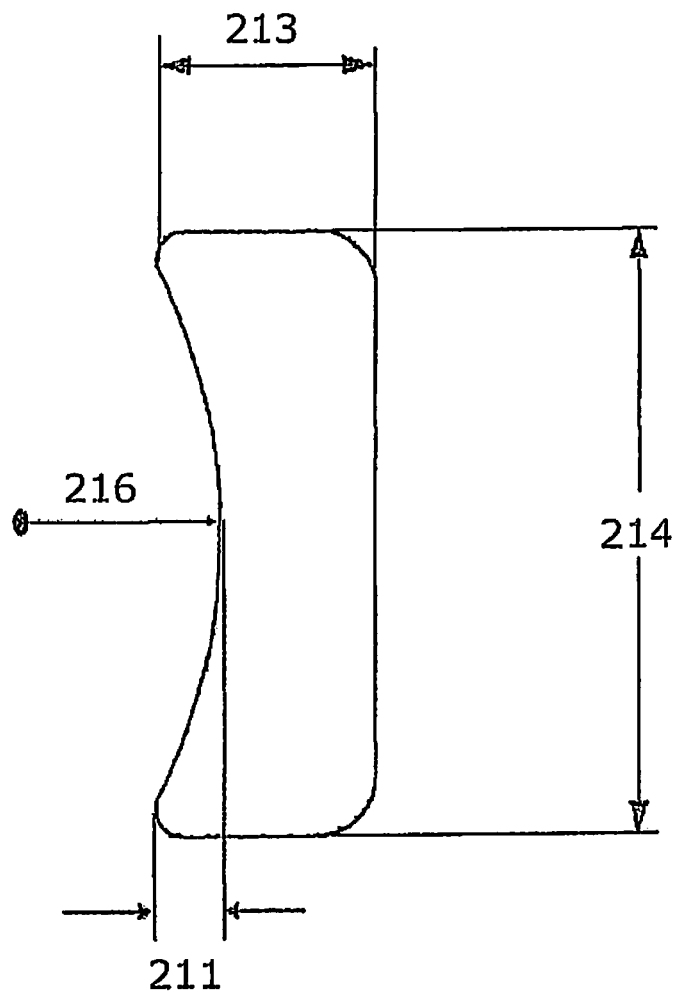
FIG. 10 shows a cross-sectional view of an alternate embodiment of an elastomeric band having a concave outer surface in an uncompressed state.

FIG. 10 shows a cross-sectional view of an elastomeric band 200 in accordance with another embodiment wherein the elastomeric band 200 is in a non-compressed state prior to placement in the groove 190. The height 214 of the elastomeric band 200 is preferably about 0.087 inch and the width 213 about 0.031 inch. The inner diameter of the elastomeric band 200 is about 11.3 inches. The depth of concavity, dimension 211, of elastomeric band 200 is about 0.01 inch. The concavity of the elastomeric band 200 can have a radius of curvature 216 of about 0.085 inch. Each corner of the band is preferably rounded with a radius of 0.002 to 0.01 inch.

Figure 11:
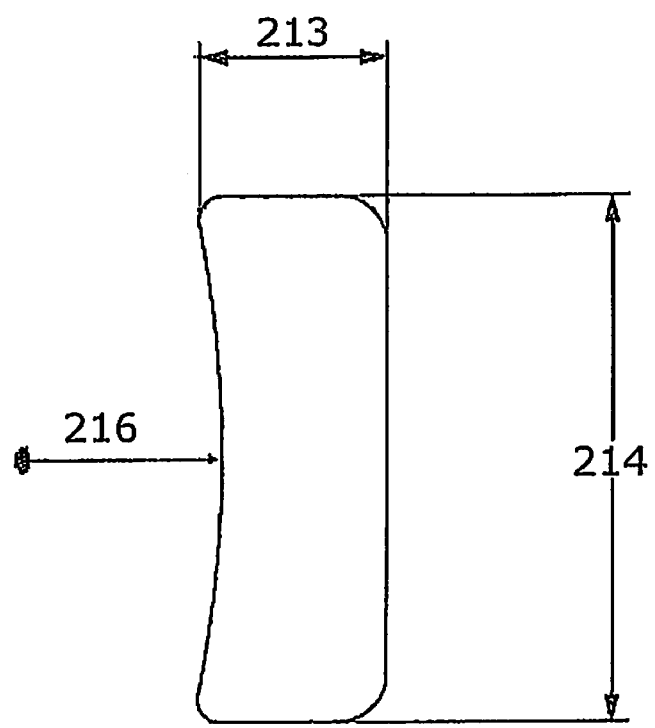
FIG. 11 shows a cross-sectional view of an alternate embodiment of an elastomeric band having a concave outer surface in an uncompressed state.

FIG. 11 shows a cross-sectional view of an elastomeric band 200 in accordance with another embodiment wherein the elastomeric band 200 is in a non-compressed state prior to placement in the groove 190. The height 214 of the elastomeric band 200 is preferably about 0.087 inch and the width 213 about 0.031 inch. The inner diameter of the elastomeric band 200 is about 11.3 inches. The concavity of the elastomeric band 200 can have a radius of curvature 216 between about 0.02 to 0.8 inch and preferably about 0.20 inch. Each corner of the band is preferably rounded with a radius of 0.002 to 0.01 inch.

In a preferred embodiment, the electrode assembly 150 is an electrostatic chuck (ESC) useful for clamping substrates such as semiconductor wafers during processing thereof in a vacuum processing chamber for semiconductor fabrication, e.g., a plasma reactor such as a plasma etch reactor. The ESC can be a mono-polar or a bi-polar design. The electrode assembly 150, however, can be used for other purposes such as clamping substrates during chemical vapor deposition, sputtering, ion implantation, resist stripping, etc.

The electrode assembly 150 comprises the upper ceramic member 180. Ceramic members 180 can have a thickness of about 1 or 3 mm. The erosion patterns of the elastomeric bands 200 are dependent on the thickness of the ceramic plate, as such embodiments of elastomeric bands having varying dimensions accommodate the differing erosion patterns.

It can be appreciated that the electrode assembly 150 can be installed in any new processing chamber suitable for plasma processing semiconductor substrates or used to retrofit existing processing chambers. It should be appreciated that in a specific system, the specific shape of the upper member 180, the lower member 100 and the heater 140 may vary depending on the arrangement of chuck, substrate and/or other components. Therefore, the exact shape of the upper member 180, the lower member 100 and the heater 140 as shown in FIGS. 2-11 are shown for illustration purposes only and are not limiting in any way.

The edge seal can be mounted in other lower electrode assemblies which do not include heater plates. For example, the elastomeric band can be mounted in a mounting groove surrounding a bond layer in a lower electrode assembly having an upper plate, and a temperature controlled lower base plate wherein the band is mounted in the groove such that upper and lower ends of the band are compressed and a maximum outward building of the band is no greater than a predetermined distance.

An edge seal as disclosed herein can provide advantages over elastomeric bands with rectangular cross-sections. For example, the edge seal with concave outer surface can provide increased serviceability of the lower electrode assembly in chambers such as plasma etch chambers. This increased serviceability results from a reduced tendency of the outer surface to crack when the edge seal is axially compressed in the mounting groove and less tendency to bind with surrounding parts such as edge rings. If desired, the band can include a geometrical feature on its inner surface such as one or more grooves or projections such as dimples. Such features provide a ready indicator of which surface should face the groove when the band is installed in a groove.

The term "about" as used herein with respect to dimensions means plus or minus 10% of the dimension.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. An edge seal for sealing an outer surface of a lower electrode assembly, the lower electrode assembly including an annular groove defined between a lower member and an upper member of the lower electrode assembly, the edge seal comprising:

an elastomeric band configured to be arranged within the annular groove, and compressed, the elastomeric band comprising a flat annular upper surface arranged between an inner top corner and an outer top corner, a flat annular lower surface arranged between an inner lower corner and an outer lower corner, an inner surface extending from the inner top corner to the inner lower corner, the inner surface has a uniform diameter, the entire inner surface being perpendicular to both the flat annular upper surface and the flat annular lower surface, and an outer surface extending from the outer top corner to the outer lower corner, the outer surface comprises a concave surface, wherein the concaved surface defines a smallest outer diameter of the elastomeric band at about a midpoint between the outer top corner and the outer lower corner, wherein, the concaved surface is configured to bulge outwardly in a direction that is radially outward relative to the groove;

when the flat annular upper surface and the flat annular lower surfaces are axially compressed at least 1% such that the elastomeric band is in a compressed state, an outward bulging of the outer surface is not greater than a predetermined distance, and the predetermined distance corresponds to a maximum outer diameter of the elastomeric band in the uncompressed state.

2. The edge seal of claim 1, wherein the outer surface is (i) a single curved surface, (ii) a single inclined surface such that the band is widest at an upper end thereof and narrowest at a lower end thereof, or (iii) a pair of converging surfaces which form an obtuse angle such that the band is widest at upper and lower ends thereof and narrowest at a middle thereof.

3. The edge seal of claim 1, wherein the outer surface of the elastomeric band includes a cylindrical surface of uniform diameter at an upper end of the elastomeric band extending less than 1/10 of a height of the band.

4. The edge seal of claim 1, wherein the elastomeric band has a height of 0.05 to 0.15 inch, a width of 0.025 to 0.050 inch, and inner diameter of 11.3 to 11.4 inches and each edge of the band is rounded with a radius of 0.001 to 0.010 inch.

5. The edge seal of claim 1, wherein the elastomeric band has an outer upper cylindrical surface of uniform diameter extending about 0.01 inch from the flat upper annular surface and an outer lower cylindrical surface of uniform diameter extending about 0.01 inch from the flat lower annular surface, and the concaved surface has a uniform radius extending between the outer upper cylindrical surface and the outer lower cylindrical surface.

6. The edge seal of claim 1, wherein the flat lower annular surface is smaller in width than the flat upper annular surface, the elastomeric band includes an outer cylindrical surface of uniform diameter extending about 0.01 inch from the flat upper annular surface and the concaved surface has a uniform radius extending between the outer cylindrical surface and the flat lower annular surface.

7. The edge seal of claim 1, wherein the predetermined distance is no greater than 0.004 inch.

8. The edge seal of claim 1, wherein the elastomeric band flat upper and lower surfaces of equal width, an outer curved surface extending between the upper and lower surfaces, and each edge of the band is rounded.

9. The edge seal of claim 1, wherein the edge seal is made of perfluoroelastomer material having a Shore Hardness A of 60 to 75 and a specific gravity of 1.9 to 2.1.

10. The edge seal of claim 1, wherein the edge seal has a cross-sectional aspect ratio of height:thickness of 2 to 5.

11. The edge seal of claim 1, wherein the outer surface of the edge seal has a radius of curvature from 0.02 to 0.8 inches.

12. The edge seal of claim 1, wherein the elastomeric band has a metallic content less than 5000 parts per billion for each metal element comprised therein.

13. The edge seal of claim 1, wherein the elastomeric band has a depth of concavity from 0.001 to 0.01 inches.

* * * * *